(12) United States Patent
Oh et al.

(10) Patent No.: US 7,569,904 B2
(45) Date of Patent: Aug. 4, 2009

(54) SEMICONDUCTOR DEVICE HAVING A PLURALITY OF TEMPERATURE SENSORS AND SEMICONDUCTOR DEVICE CONTROL METHOD USING THE PLURALITY OF TEMPERATURE SENSORS

(75) Inventors: Boa-Yeong Oh, Hwaseong-si (KR); Sang-Seok Kang, Suwon-si (KR); Kyoung-Moo Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 404 days.

(21) Appl. No.: 11/177,242

(22) Filed: Jul. 8, 2005

(65) Prior Publication Data

US 2006/0012930 A1    Jan. 19, 2006

(30) Foreign Application Priority Data

Jul. 8, 2004    (KR) ............... 10-2004-0052974

(51) Int. Cl.
*H01L 31/058*    (2006.01)
(52) U.S. Cl. ............................. 257/467; 257/E29.347
(58) Field of Classification Search ................. 257/401, 257/467, 252, 414, E29.347
See application file for complete search history.

(56) References Cited

U.S. PATENT DOCUMENTS 6,167,330 A * 12/2000 Linderman ................. 700/295
6,798,706 B2 * 9/2004 Barth et al. ................. 365/211
2002/0084928 A1 * 7/2002 Nale ............................ 341/164

FOREIGN PATENT DOCUMENTS

KR    2002-0071712    9/2002
KR    2003-0035767    5/2003

OTHER PUBLICATIONS

Korean Intellectual Property Office Korean Patent Abstracts for Publication No. 1020020071712 A.
Korean Intellectual Property Office Korean Patent Abstracts for Publication No. 1020030035767 A.

* cited by examiner

*Primary Examiner*—Matthew E Warren
(74) *Attorney, Agent, or Firm*—F. Chau & Associates, LLC

(57) ABSTRACT

A semiconductor device comprises a plurality of banks, a plurality of control circuits, and a plurality of temperature sensors, wherein each of the plurality of temperature sensors is disposed near at least one of the plurality of banks for sensing the temperature of the area surrounding the at least one of the plurality of banks and for outputting a sense signal corresponding to a sensed temperature, and each of the plurality of control circuits outputs at least one control signal, for controlling an operation of the at least one of the plurality of banks, to the at least one of the plurality of banks based on the sense signal.

6 Claims, 6 Drawing Sheets

US 7,569,904 B2

SEMICONDUCTOR DEVICE HAVING A PLURALITY OF TEMPERATURE SENSORS AND SEMICONDUCTOR DEVICE CONTROL METHOD USING THE PLURALITY OF TEMPERATURE SENSORS

CROSS-REFERENCE TO RELATED APPLICATION

This application claims priority to Korean Patent Application No. 10-2004-0052974, filed on Jul. 8, 2004 of which is incorporated herein in its entirety by reference.

TECHNICAL FIELD

The present invention relates to a semiconductor device, and more particularly, to a semiconductor device including a plurality of temperature sensors and a method of controlling operations of the semiconductor device using the plurality of temperature sensors.

BACKGROUND

FIG. 1 shows a block diagram of a conventional semiconductor device 100 including a temperature sensor 150. The conventional semiconductor device (or, a semiconductor chip) 100 includes a plurality of banks 110, 120, 130 and 140, the temperature sensor 150, and a controller 160.

Each of the plurality of banks 110, 120, 130 and 140 may operate independently. For example, the banks 130 and 140 operate while the banks 110, 120 do not. In such instance, the temperature of the area surrounding the banks 130 and 140 is higher than the temperature of the area surrounding the banks 110 and 120. However, when the temperature sensor 150 is capable of sensing a temperature only for the area surrounding the bank 110, the temperature of the area surrounding banks 130 and 140 is not measured correctly.

If the temperature of the area surrounding the bank 110 is lower than 45° C., the controller 160 outputs a self-refresh signal with a period of 420 ms to each of the plurality of banks 110, 120, 130 and 140 in response to an output signal of the temperature sensor 150. If the temperature of the area surrounding the bank 110 is higher than 45° C., the controller 160 outputs a self-refresh signal with a period of 140 ms to each of the plurality of banks 110, 120, 130 and 140.

If the temperature of the area surrounding the bank 140 is higher than 50° C. due to the operation of the bank 140, and the temperature of the area surrounding the bank 110 is lower than 40° C. due to non-operation of the bank 110, the temperature sensor 150 cannot sense the temperature of the area surrounding the bank 140. Thus, the controller 160 outputs the self-refresh signal with a period of 420 ms as a result of the lower temperature of the area surrounding the bank 110. Since the controller 160 outputs the self-refresh signal with a period of 420 ms to each of the plurality of banks 110, 120, 130 and 140, data to be input to or output from the bank 140 can fail.

SUMMARY OF THE INVENTION

In an exemplary embodiment of the present invention, a semiconductor device comprises a plurality of banks, a plurality of control circuits, and a plurality of temperature sensors, wherein each of the plurality of temperature sensors is disposed near at least one of the plurality of banks for sensing the temperature of the area surrounding the at least one of the plurality of banks and for outputting a sense signal corresponding to a sensed temperature, and each of the plurality of control circuits outputs at least one control signal, for controlling an operation of the at least one of the plurality of banks, to the at least one of the plurality of banks based on the sense signal.

In another exemplary embodiment of the present invention, a semiconductor device comprises a plurality of banks, a plurality of control circuits, a plurality of temperature sensors, wherein each of the plurality of temperature sensors senses the temperature of the area surrounding at least one circuit disposed at a predetermined location, and a logic circuit performing a logic operation on sense signals output from the plurality of temperature sensors and outputting a result of the logic operation, wherein the each of the plurality of temperature sensors is disposed near at least one of the plurality of banks for sensing the temperature of the area surrounding the at least one of the plurality of banks and for outputting a sense signal corresponding to a sensed temperature, and each of the plurality of control circuits outputs at least one control signal, for controlling an operation of at least one of the plurality of banks, to the at least one of the plurality of banks based on an output signal of the logic circuit.

In still another exemplary embodiment of the present invention, a method of controlling the operation of banks of a semiconductor device including a plurality of banks, a plurality of control circuits, and a plurality of temperature sensors using output signals of the plurality of temperature sensors, the method comprises sensing the temperatures of the area surrounding circuits corresponding to the plurality of temperature sensors disposed in different locations, outputting sense signals corresponding to sensed temperatures, generating control signals in the plurality of control circuits for controlling operations of corresponding banks based on the sense signals, and performing operations in the plurality of banks based on the control signals.

These and other exemplary embodiments, aspects, features and advantages of the present invention will become apparent from the following detailed description of exemplary embodiments, which is to be read in connection with the accompanying drawings.

DETAILED DESCRIPTION OF EXEMPLARY EMBODIMENT

Exemplary embodiments of the present invention will now be described more fully hereinafter below with reference to the accompanying drawings. This invention may, however, be embodied in different forms and should not be construed as limited to the exemplary embodiments set forth herein. Rather, these exemplary embodiments are provided so that this disclosure will be through and complete, and will fully convey the scope of the invention to those skilled in the art.

Figure 1:
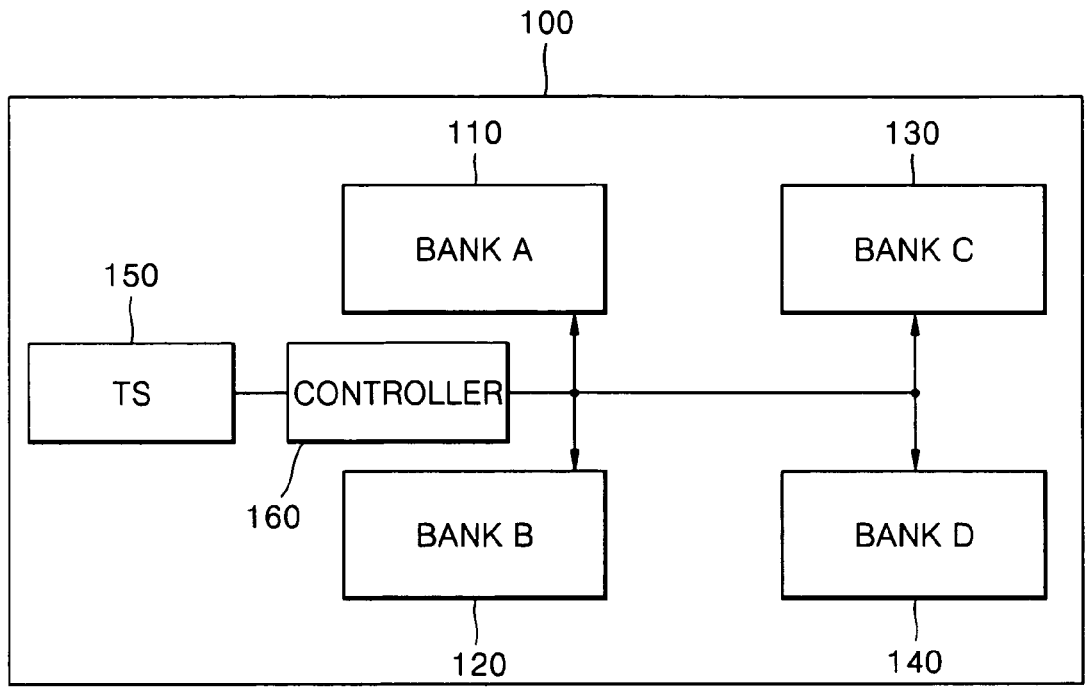
FIG. 1 shows a block diagram of a conventional semiconductor device including a temperature sensor.
Figure 2:
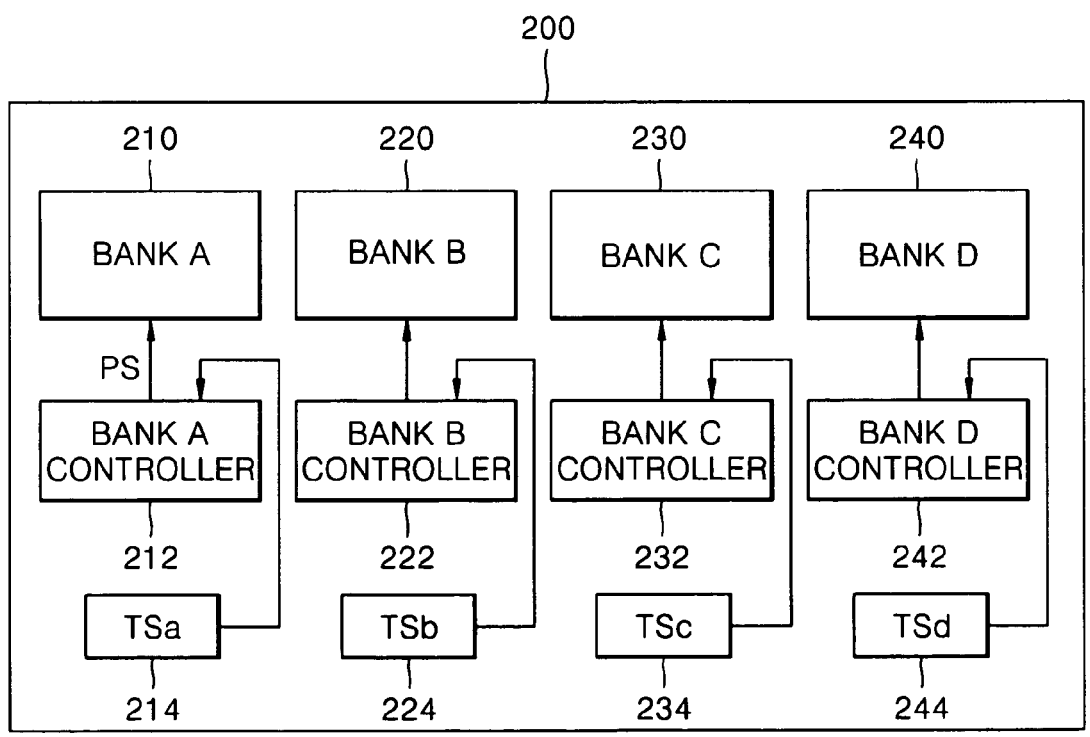
FIG. 2 shows a block diagram of a semiconductor device including a plurality of temperature sensors according to an exemplary embodiment of the present invention.

FIG. 2 shows a block diagram of a semiconductor device 200 including a plurality of temperature sensors 214, 222, 234 and 244 according to an exemplary embodiment of the present invention. Referring to FIG. 2, the semiconductor device (or, a semiconductor chip) 200 includes a plurality of banks 210, 220, 230, and 240, a plurality of control circuits (or, controllers) 212, 222, 232, and 242, and the plurality of temperature sensors 214, 224, 234, and 244.

The temperature sensors 214, 224, 234, and 244 are disposed near the banks 210, 220, 230, and 240, respectively. In another exemplary embodiment of the present invention, the temperature sensors 214, 224, 234 and 244 are disposed near at least one of internal voltage converters consuming a large amount of current, boosting circuits, output drivers, sense amplifiers, and input/output drivers, as shown in FIGS. 5 through 8. The temperature sensors 214, 224, 234 and 244 sense the temperatures of the area surrounding the banks 210, 220, 230 and 240 or of the area surrounding devices such as the internal voltage converters, the boosting circuits, the output drivers, the sense amplifiers, and the input/output drivers. The temperature sensors 214, 224, 234 and 244 output sense signals, corresponding to sensed temperatures, to the control circuits 212, 222, 223, and 224, respectively. Each of the control circuits 212, 222, 232, and 242 outputs at least one control signal to the banks 210, 220, 230, and 240, respectively, to control operations of the banks 210, 220, 230, and 240 in response to corresponding sense signals received from the temperature sensors 214, 224, 234 and 244.

Figure 3:
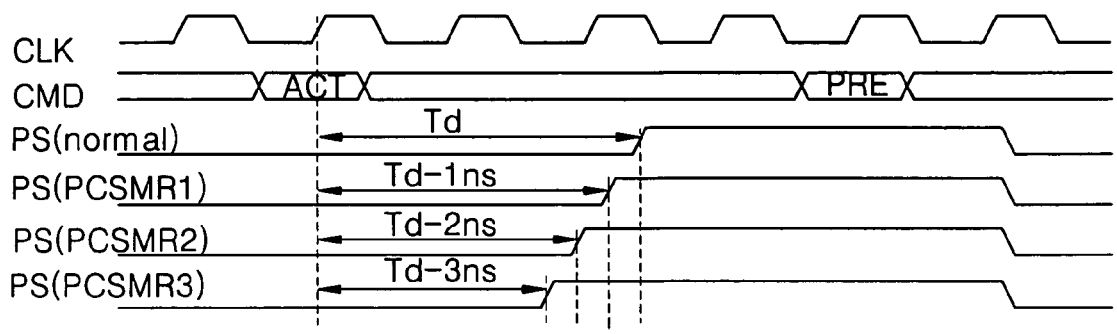
FIG. 3 shows a timing diagram of an output signal of a control circuit.

FIG. 3 shows a timing diagram of an output signal of the control circuit 212 connected to the bank 210. Referring to FIGS. 2 and 3, the control circuit 212 outputs a sense enable signal (PS) to the bank 210 in response to a clock signal (CLK), a command signal (CMD), and the sense signal output from the temperature sensor 214. The bank 210 senses and amplifies data of a corresponding memory cell in response to the sense enable signal PS and then reads the data.

In FIGS. 2 and 3, a sense enable signal (PS) is shown according to an exemplary embodiment of the present invention. In another exemplary embodiment of the present invention, various control signals capable of controlling data write operations or data read operations of the bank 210 can be output to the bank 210.

Referring to FIG. 3, as the temperature of the area surrounding the bank 210 increases, the time delay Td of the sense enable signal PS decreases. AC parameters of the bank 210, for example, tRCD (/RAS to /CAS delay time), tSAC (clock to valid output delay), are controlled by the sense enable signal PS. Also, a boosting margin, a charge shearing margin, a precharge margin, and a frequency margin of the bank 210 are controlled by the sense enable signal PS.

Figure 4:
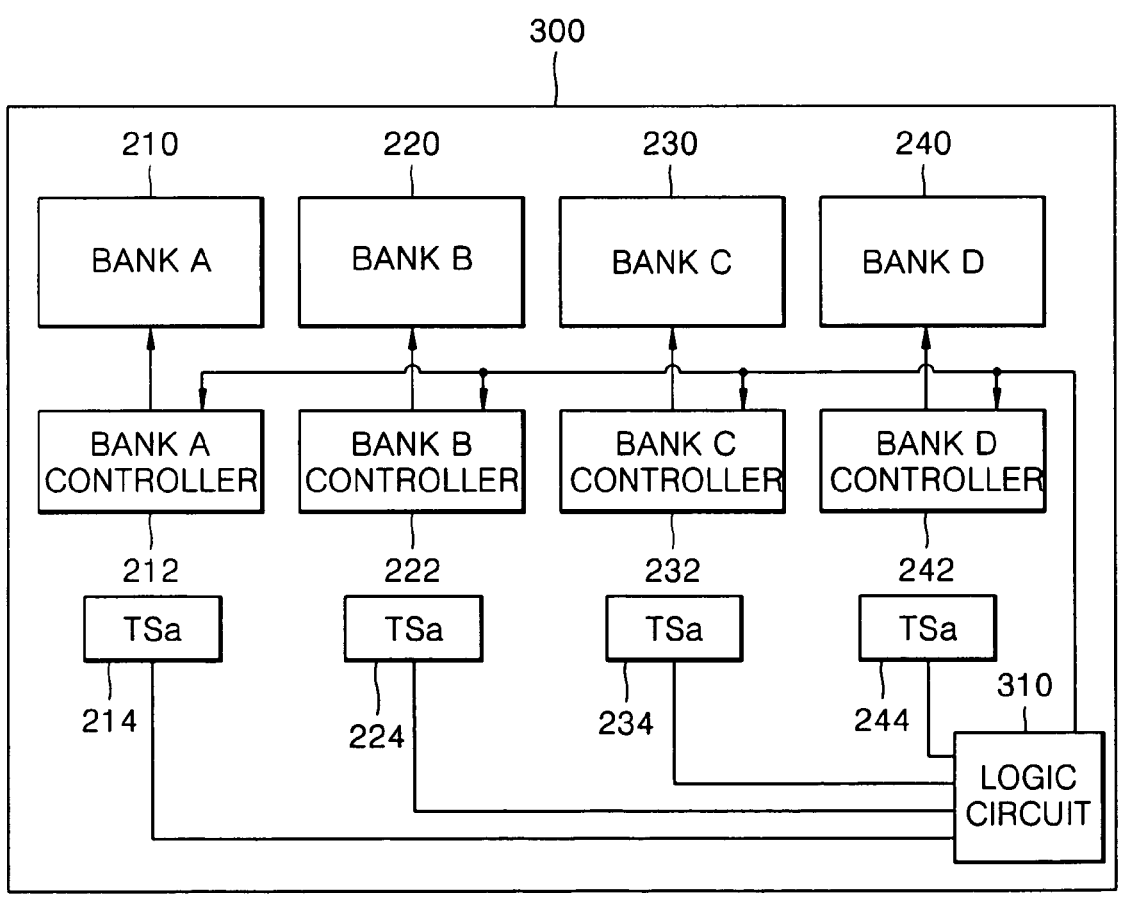
FIG. 4 shows a block diagram of a semiconductor device including a plurality of temperature sensors according to another exemplary embodiment of the present invention.

FIG. 4 shows a block diagram of a semiconductor device 300 including the plurality of temperature sensors 214, 224, 234 and 244 according to another exemplary embodiment of the present invention. The semiconductor device 300 shown in FIG. 4 is substantially similar to the semiconductor device 200 shown in FIG. 2, except that the semiconductor device 300 includes a logic circuit 310. The logic circuit 310 may be an OR gate, an AND gate, a NOR gate, or a NAND gate.

For example, when the logic circuit 310 is implemented by an OR gate 310, the OR gate 310 performs an OR operation on output signals of the plurality of temperature sensors 214, 224, 234, and 244, and outputs a result to the control circuits 212, 222, 232, and 242. To control the operations of the banks 210, 220, 230 and 240, each of the control circuits 212, 222, 232, and 242 outputs at least a control signal to the corresponding banks 210, 220, 230, and 240, respectively, in response to an output signal of the OR gate 310.

Figure 5:
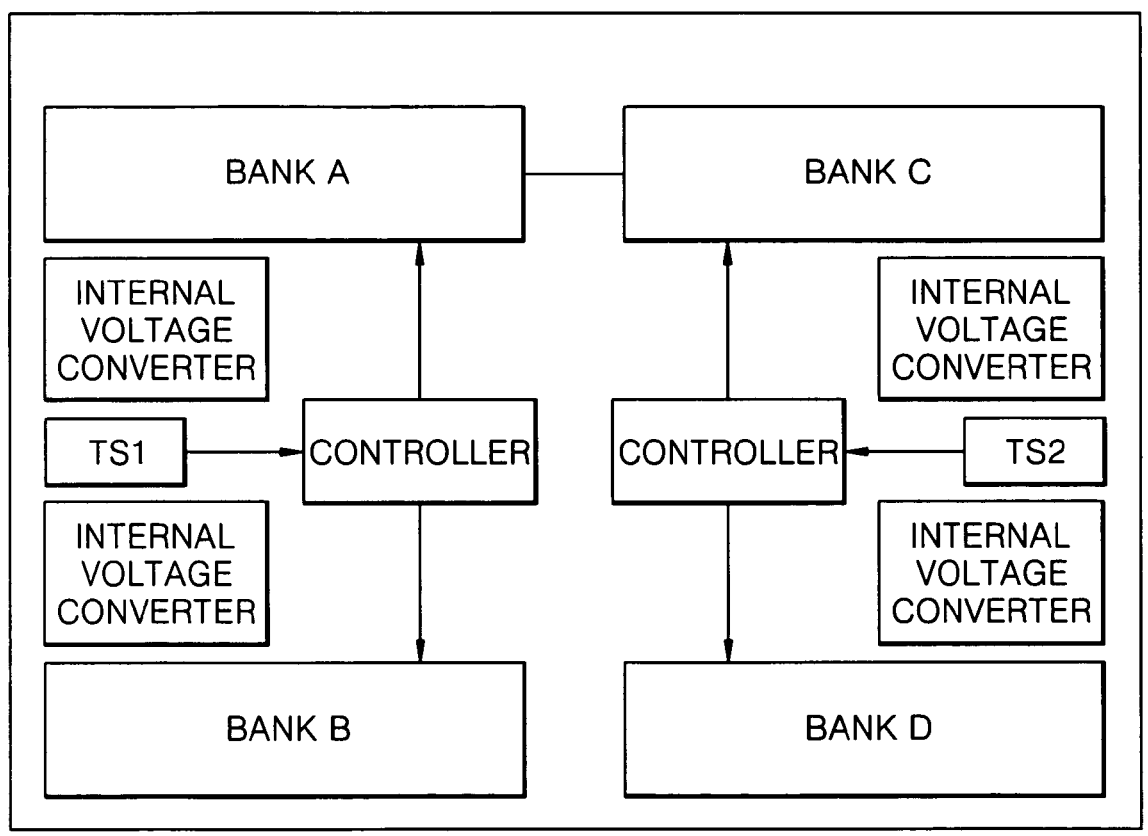
FIG. 5 shows an arrangement of a plurality of temperature sensors according to an exemplary embodiment of the present invention.

FIG. 5 shows an arrangement of a plurality of temperature sensors TS1 and TS2, according to an exemplary embodiment of the present invention. Referring to FIG. 5, temperature sensors TS1 and TS2 are disposed near internal voltage converters consuming large amounts of current. The temperature sensors TS1 and TS2 sense the temperatures of the area surrounding the internal voltage converters and/or the temperatures of the area surrounding banks, and output the sensed temperatures to corresponding control circuits. To control the operation of the banks, each of the control circuits outputs at least a control signal to the corresponding bank in response to a sense signal received from the temperature sensors TS1 and TS2. The control circuits control, for example, the boosting margin, the charge shearing margin, the precharge margin, and the frequency margin of the banks based on the temperatures of the area surrounding the internal voltage converters.

Figure 6:
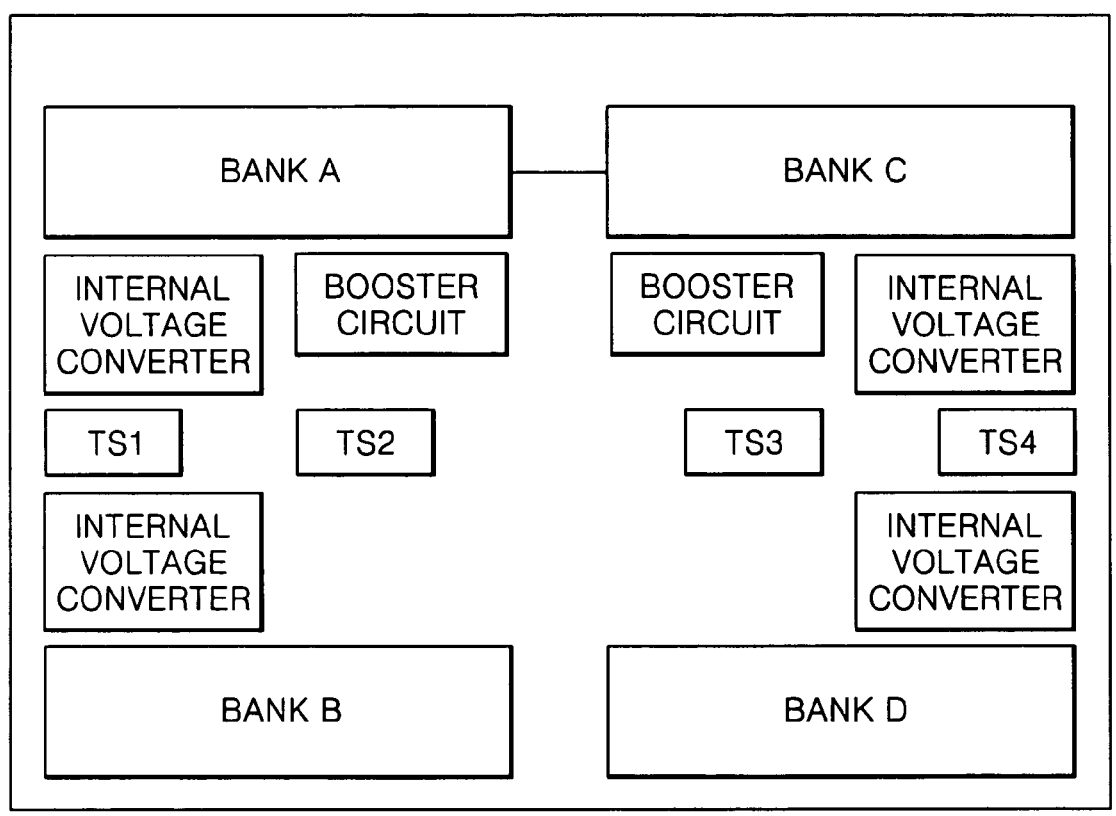
FIG. 6 shows an arrangement of the plurality of temperature sensors according to another exemplary embodiment of the present invention.

FIG. 6 shows an arrangement of the plurality of temperature sensors according to another exemplary embodiment of the present invention. Referring to FIG. 6, a semiconductor device includes a plurality of temperature sensors TS1, TS2, TS3, and TS4. The temperature sensors TS1 and TS4 sense the temperatures of the area surrounding internal voltage converters, and output sense signals corresponding to the sensed temperatures to corresponding control circuits (not shown).

The temperature sensor TS2 senses the temperature of the area surrounding a booster circuit, and outputs a sense signal corresponding to the sensed temperature to a corresponding control circuit (not shown). The temperature sensor TS3 senses the temperatures of the area surrounding the booster circuit and an output driver, and outputs sense signals corresponding to the sensed temperatures to corresponding control circuits.

Figure 7:
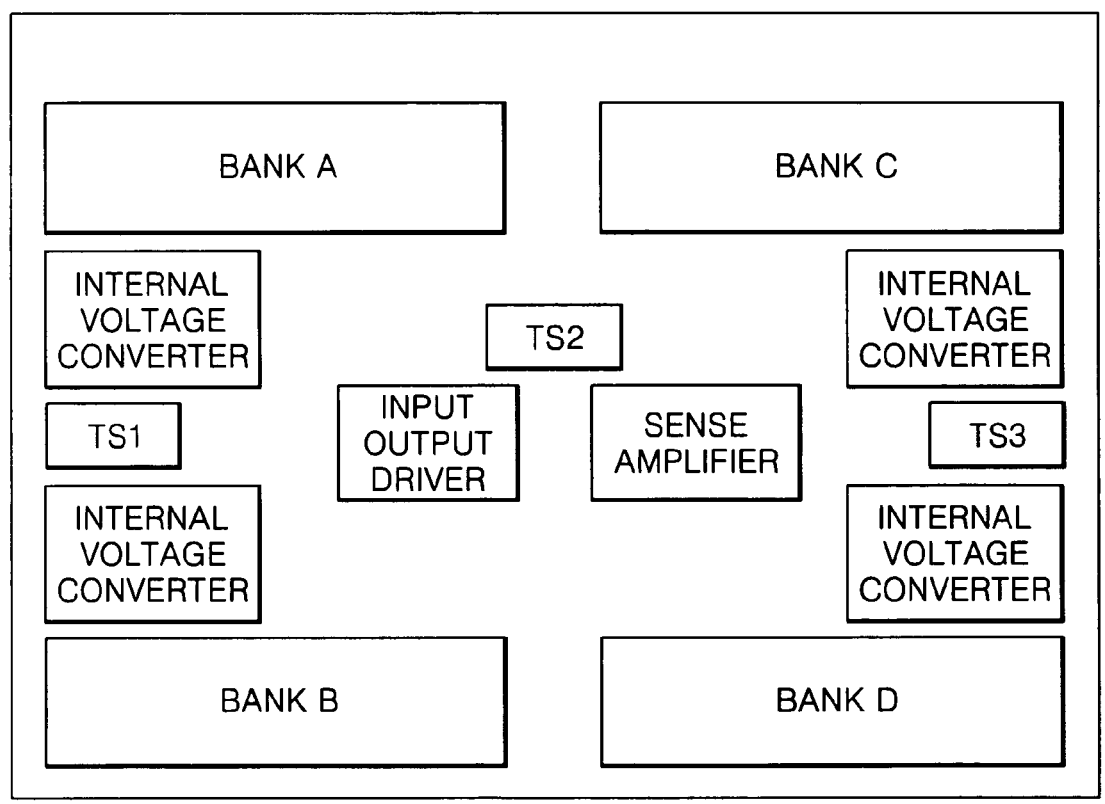
FIG. 7 shows an arrangement of the plurality of temperature sensors according to another exemplary embodiment of the present invention.

FIG. 7 shows an arrangement of the plurality of temperature sensors according to another exemplary embodiment of the present invention. Referring to FIG. 7, the semiconductor device includes a plurality of temperature sensors TS1, TS2, and TS3. The temperature sensors TS1 and TS3 sense the temperatures of the area surrounding internal voltage converters, and output sense signals corresponding to the sensed temperatures to corresponding control circuits (not shown).

The temperature sensor TS2 senses the temperature of the area surrounding a sense amplifier consuming a large amount of current and an input/output driver, and outputs a sense signal corresponding to the sensed temperature to a corresponding control circuit (not shown).

Figure 8:
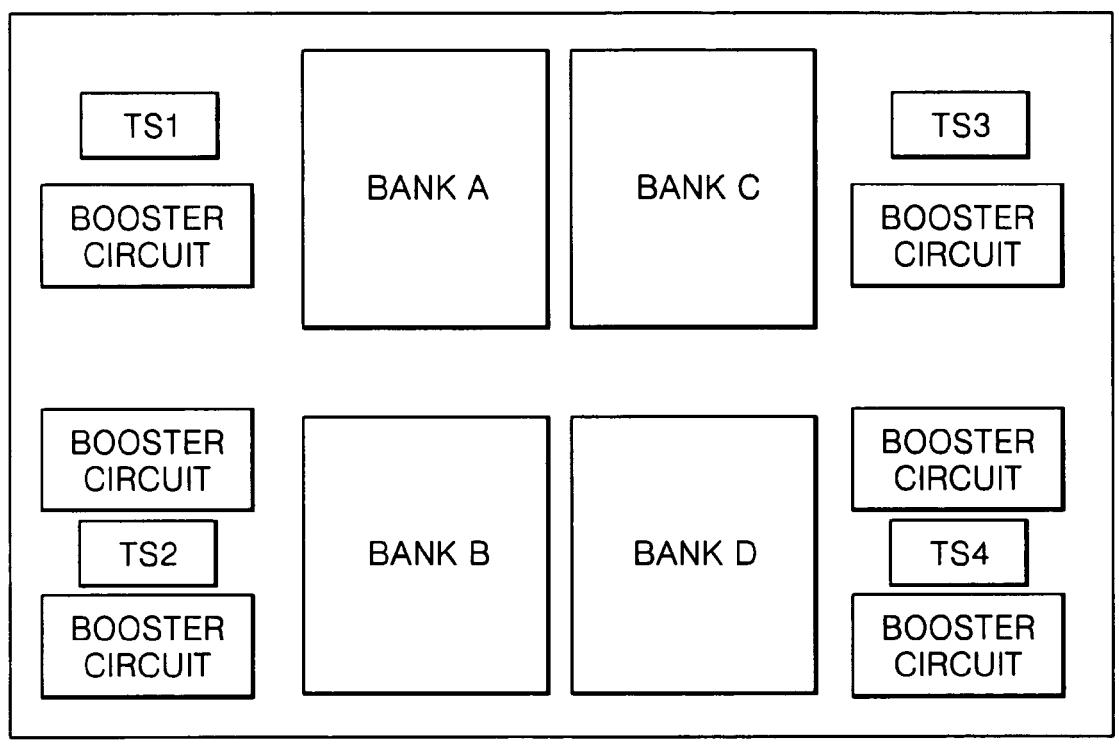
FIG. 8 shows an arrangement of the plurality of temperature sensors according to another exemplary embodiment of the present invention.

FIG. 8 shows an arrangement of the plurality of temperature sensors according to another exemplary embodiment of the present invention. Referring to FIG. 8, the semiconductor device includes a plurality of temperature sensors TS1, TS2, TS3, and TS4. For example, the temperature sensor TS1 senses the temperature of the area surrounding a booster circuit and/or a bank, and outputs sense signals corresponding to the sensed temperature to a corresponding control circuit (not shown).

As described above with reference to FIGS. 2 through 8, since each of the plurality of temperature sensors can sense the temperatures of the area surrounding each device, and outputs a sense signal corresponding to the sensed temperature to a corresponding control circuit, each control circuit can precisely control the pulse width (for example, enable period or disable period) of a control signal or the signal margins in response to the sense signals. The control signals or the signal margins are needed for the operation (for example, data write operation or data read operation) of a corresponding bank. Therefore, the semiconductor device including the plurality of temperature sensors can stably operate when a temperature change occurs.

In the semiconductor device including the plurality of banks, the plurality of control circuits, and the plurality of temperature sensors, operations of the plurality of banks are controlled based on the output signals of the plurality of temperature sensors.

As described above, according to exemplary embodiments of the present invention, since a semiconductor device can sense temperature changes at predetermined locations using a plurality of temperature sensors therein, temperature-sensitive circuits therein can be controlled.

Although exemplary embodiments have been described herein with reference to the accompanying drawings, it is to be understood that the present invention is not limited to such exemplary embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor device comprising:
   a plurality of banks;
   a plurality of control circuits; and
   a plurality of temperature sensors,
   wherein each of the plurality of temperature sensors is disposed near at least one of the plurality of banks for sensing the temperature of the area surrounding the at least one of the plurality of banks and for outputting a sense signal corresponding to a sensed temperature, and each of the plurality of control circuits outputs at least one control signal, for controlling an operation of the at least one of the plurality of banks, to the at least one of the plurality of banks in response to a command signal and the sense signal,
   wherein as the temperature of the area surrounding the at least one of the plurality of banks increases, the time delay of the at least one control signal decreases.

2. The semiconductor device of claim 1, wherein the at least one control signal is delayed based on the sense signal.

3. The semiconductor device of claim 1, wherein each of the plurality of temperature sensors is disposed near at least one of an internal voltage converter, a booster circuit, an output driver, a sense amplifier, and an input/output driver.

4. A semiconductor device comprising:
   a plurality of banks;
   a plurality of control circuits;
   a plurality of temperature sensors,
   wherein each of the plurality of temperature sensors senses the temperature of the area surrounding at least one circuit disposed at a predetermined location; and
   a logic circuit performing a logic operation on sense signals output from the plurality of temperature sensors and outputting a result of the logic operation, wherein the each of the plurality of temperature sensors is disposed near at least one of the plurality of banks for sensing the temperature of the area surrounding the at least one of the plurality of banks and for outputting a sense signal corresponding to a sensed temperature, and each of the plurality of control circuits outputs at least one control signal, for controlling an operation of at least one of the plurality of banks, to the at least one of the plurality of banks in response to a command signal and an output signal of the logic circuit,
   wherein as the temperature of the area surrounding the at least one of the plurality of banks increases, the time delay of the at least one control signal decreases.

5. The semiconductor device of claim 4, wherein the at least one circuit is at least one of the plurality of banks, an internal voltage convener, a booster circuit, an output driver, a sense amplifier and an input/output driver.

6. The semiconductor device of claim 4, wherein the at least one circuit is a circuit consuming a large amount of current compared to other circuits disposed on the semiconductor device.

* * * * *